United States Patent
Zhang et al.

(10) Patent No.: US 11,158,517 B2
(45) Date of Patent: Oct. 26, 2021

(54) SELECTIVE PLASMA ETCHING OF SILICON OXIDE RELATIVE TO SILICON NITRIDE BY GAS PULSING

(71) Applicant: Tokyo Electron Limited, Tokyo (JP)

(72) Inventors: Du Zhang, Albany, NY (US); Yu-Hao Tsai, Albany, NY (US); Mingmei Wang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/739,889

(22) Filed: Jan. 10, 2020

(65) Prior Publication Data

US 2020/0234968 A1  Jul. 23, 2020

Related U.S. Application Data

(60) Provisional application No. 62/926,754, filed on Oct. 28, 2019, provisional application No. 62/793,893, filed on Jan. 18, 2019.

(51) Int. Cl.
*H01L 21/3105* (2006.01)
*H01L 21/311* (2006.01)
(Continued)

(52) U.S. Cl.
CPC .... *H01L 21/31116* (2013.01); *H01L 21/3065* (2013.01); *H01L 21/32137* (2013.01)

(58) Field of Classification Search
CPC .............. H01L 21/31056; H01L 21/31116
See application file for complete search history.

(56) References Cited

U.S. PATENT DOCUMENTS 8,187,486 B1 *  5/2012  Liu .............. H01L 21/0206
                                            216/76
2013/0119018 A1 *  5/2013  Kanarik ......... H01J 37/32146
                                            216/67
(Continued)

FOREIGN PATENT DOCUMENTS

JP          3628863 B2      3/2005
KR       10-1931742 B1     12/2018
WO        2013-025336 A1    2/2013

OTHER PUBLICATIONS

Korean Intellectual Property Office, International Search Report and Written Opinion for International application No. PCT/US2020/013125, dated May 8, 2020, 10pp.

*Primary Examiner* — Thomas T Pham

(57) ABSTRACT

A method for selective plasma etching of silicon oxide relative to silicon nitride. The method includes a) providing a substrate containing a silicon oxide film and a silicon nitride film, b) exposing the substrate to a plasma-excited treatment gas containing 1) $H_2$ and 2) HF, $F_2$, or both HF and $F_2$, to form a silicon oxide surface layer with reduced oxygen content on the silicon oxide film and form an ammonium salt layer on the silicon nitride film, c) exposing the substrate to a plasma-excited halogen-containing gas that reacts with and removes the silicon oxide surface layer from the silicon oxide film, and d) repeating steps b) and c) at least once to further selectively etch the silicon oxide film relative to the ammonium salt layer on the silicon nitride film. The ammonium salt layer may be removed when the desired etching has been achieved.

19 Claims, 4 Drawing Sheets

Figure 1A:
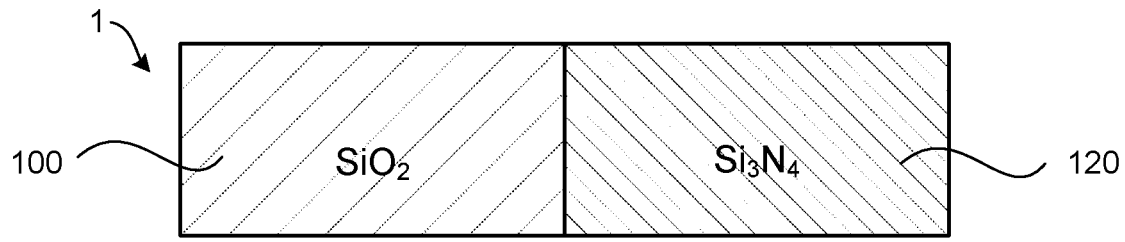

(51) Int. Cl.
*H01L 21/3213* (2006.01)
*H01L 21/3065* (2006.01)

(56) References Cited

U.S. PATENT DOCUMENTS

2014/0004708 A1    1/2014   Thedjoisworo et al.
2015/0270122 A1    9/2015   Tolle et al.
2017/0330759 A1* 11/2017   Gohira .............. H01L 21/67069

* cited by examiner

SELECTIVE PLASMA ETCHING OF SILICON OXIDE RELATIVE TO SILICON NITRIDE BY GAS PULSING

CROSS-REFERENCE TO RELATED APPLICATIONS

This application is related to and claims priority to U.S. Provisional Patent Application Ser. No. 62/793,893 filed on Jan. 18, 2019, the entire contents of which are herein incorporated by reference. This application is related to and claims priority to U.S. Provisional Patent Application Ser. No. 62/926,754 filed on Oct. 28, 2019, the entire contents of which are herein incorporated by reference.

FIELD OF INVENTION

The present invention relates to the field of semiconductor manufacturing and semiconductor devices, and more particularly, to a method of selective plasma etching of silicon oxide relative to silicon nitride in semiconductor manufacturing.

BACKGROUND OF THE INVENTION

Next generation semiconductor technology development poses a huge challenge as dry etch removal of one material selective to other materials is needed, for example in the etching of <5 nm contacts. In silicon oxide or silicon nitride etching by plasmas containing fluorocarbon (FC) or hydrofluorocarbon (HFC) gases, a fluorinated carbon layer is typically formed on the film surface. The thickness, density, and atomic compositions of such a carbon layer depend on the kinetic energies and fluxes of incident ions and charge-neutral species from the plasma and strongly affect the etch rate of the material beneath it.

SUMMARY OF THE INVENTION

A method of selective plasma etching of silicon oxide relative to silicon nitride in semiconductor manufacturing is disclosed in several embodiments.

According to one embodiment, the method includes a) providing a substrate containing a silicon oxide film and a silicon nitride film, b) exposing the substrate to a plasma-excited treatment gas containing 1) $H_2$ and 2) HF, $F_2$, or both HF and $F_2$, to form a silicon oxide surface layer with reduced oxygen content on the silicon oxide film and form an ammonium salt layer on the silicon nitride film, c) exposing the substrate to a plasma-excited halogen-containing gas that reacts with and removes the silicon oxide surface layer from the silicon oxide film, and d) repeating steps b) and c) at least once to further selectively etch the silicon oxide film relative to the ammonium salt layer on the silicon nitride film. According to one embodiment, the method further includes removing the ammonium salt layer from the silicon nitride film when the desired etching of the silicon oxide film has been achieved.

According to another embodiment, the method includes a) providing a substrate containing a silicon oxide film and a silicon nitride film, b) exposing the substrate to a plasma-excited $H_2$-containing gas to form a silicon oxide surface layer with reduced oxygen content on the silicon oxide film and form a hydrogenated silicon nitride surface layer on the silicon nitride film, c) exposing the substrate to a plasma-excited halogen-containing gas that reacts with and removes the silicon oxide surface layer from the silicon oxide film and forms an ammonium salt layer from the hydrogenated silicon nitride surface layer, and d) repeating steps b) and c) at least once to further selectively etch the silicon oxide film relative to the ammonium salt layer on the silicon nitride film. According to one embodiment, the method further includes removing the ammonium salt layer from the silicon nitride film when the desired etching of the silicon oxide film has been achieved.

DETAILED DESCRIPTION OF THE DRAWINGS

In the accompanying drawings:

FIGS. 1A-1G schematically show through cross-sectional views a method of selective plasma etching of a silicon oxide film relative to a silicon nitride film by gas pulsing according to an embodiment of the invention; and FIGS. 2A-2G schematically show through cross-sectional views a method of selective plasma etching of a silicon oxide film relative to a silicon nitride film by gas pulsing according to another embodiment of the invention.

DETAILED DESCRIPTION OF SEVERAL EMBODIMENTS

A method of selective plasma etching of silicon oxide relative to silicon nitride by gas pulsing is described. Embodiments of the invention utilize diverging surface chemical reactions of silicon oxide and silicon nitride films by sequential plasma exposures of A) 1) $H_2$ and 2) HF, $F_2$, or both HF and $F_2$, and B) a halogen-containing gas at substrate temperature and gas pressure conditions that achieve selective etching of the silicon oxide film relative to the silicon nitride film. The method includes repeated cycles of a two-step process that is described with respect to surface reactions on the silicon oxide and silicon nitride films, leading to selective etching of the silicon oxide film. According to one embodiment, in the first step A), a plasma exposure of 1) $H_2$ and 2) HF, $F_2$, or both HF and $F_2$, is performed that results in chemical surface reduction of the silicon oxide film and formation of an ammonium salt layer on the silicon nitride film. Thereafter, in the second step B), a halogen-containing plasma treatment is performed that results in formation and desorption of volatile byproducts from the reduced silicon oxide film. At the end of each cycle of the two-step process, a portion of the silicon oxide film is removed, a silicon oxide film surface is restored, while the layer of an ammonium salt that is formed on silicon nitride film serves as a blocking layer.

According to one embodiment, in the first step, a $H_2$ plasma treatment is performed that results in chemical surface reduction of the silicon oxide film and chemical surface hydrogenation of the silicon nitride film. Thereafter, in the second step, a halogen-containing plasma treatment is performed that results in formation and desorption of volatile byproducts from the reduced silicon oxide film and halogen incorporation into the surface hydrogenated silicon nitride film to form an ammonium salt layer. At the end of each cycle of the two-step process, a portion of the silicon oxide film is removed, a silicon oxide film surface is restored, while the layer of an ammonium salt that is formed on silicon nitride film that serves as an etch blocking layer.

The inventive selective plasma etching process of silicon oxide relative to silicon nitride described in embodiments of the invention fundamentally differs from conventional silicon oxide or silicon nitride etching process by plasmas containing fluorocarbon (FC) or hydrofluorocarbon (HFC) gases. This allows for selective passivation on the $Si_3N_4$ film relative to the $SiO_2$ film. In the inventive process, an ammonium salt layer latter is formed in a bottom-up manner with nitrogen (N) provided from the hydrogenated $Si_3N_4$ surface layer or the $Si_3N_4$ film, whereas in the conventional etching process, a fluorinated carbon layer is formed in a top-down manner on the substrate surface during the etching process.

The method of selective plasma etching of $SiO_2$ films relative to $Si_3N_4$ films may be performed in conventional commercial plasma processing systems, including Inductively Coupled Plasma (ICP) systems, Capacitively Coupled Plasma (CCP) systems, remote plasma systems that generate plasma excited species upstream from the substrate, electron cyclotron resonance (ECR) systems, and other systems.

FIGS. 1A-1G schematically show through cross-sectional views a method of selective plasma etching of a $SiO_2$ film relative to a $Si_3N_4$ film by gas pulsing according to an embodiment of the invention. The method combines selective ammonium salt formation on the $Si_3N_4$ film and selective chemical reduction of the $SiO_2$ film to provide highly controllable and selective $SiO_2/Si_3N_4$ etching.

FIG. 1A schematically shows a substrate 1 containing a $SiO_2$ film 100 and a $Si_3N_4$ film 120. In the example shown in FIG. 1A, the $SiO_2$ film 100 and the $Si_3N_4$ film 120 are in the same horizontal plane, but embodiments of the invention may also be applied to films that are not in the same horizontal plane but are offset vertically. $Si_3N_4$ is the most thermodynamically stable of the silicon nitrides and hence the most commercially important of the silicon nitrides. However, embodiments of the invention may be applied to other silicon nitrides that contain Si and N as the major constituents, where the silicon nitrides can have a wide range of Si and N compositions. Similarly, $SiO_2$ is the most thermodynamically stable of the silicon oxides and hence the most commercially important of the silicon oxides. However, embodiments of the invention may be applied to other silicon oxides that contain Si and O as the major constituents, where the silicon oxides can have a wide range of Si and O compositions.

Figure 1B:
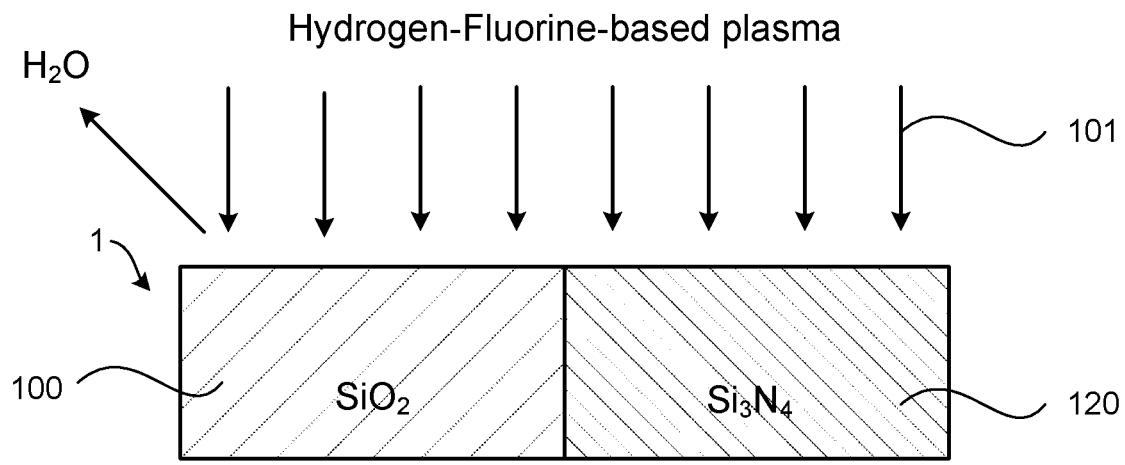
Figure 1C:
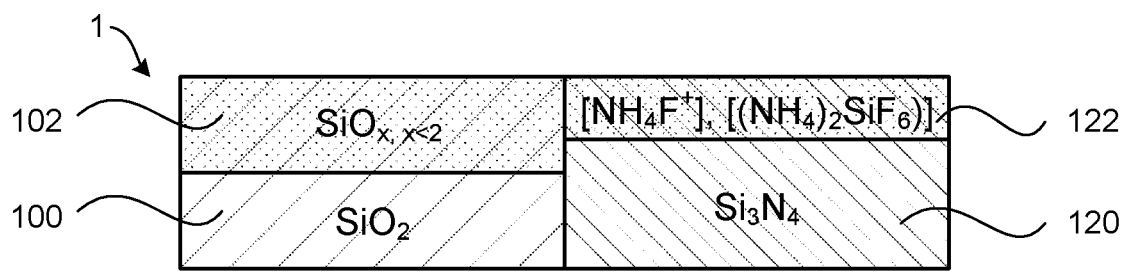

The method includes exposing the substrate 1 to a plasma-excited treatment gas 101 that is hydrogen-fluorine-based as is schematically shown in FIG. 1B. The treatment gas can contain or consist of 1) $H_2$ and HF; 2) $H_2$, HF, and a noble gas, 3) $H_2$ and $F_2$, 4) $H_2$, $F_2$, and a noble gas, 5) $H_2$, HF, and $F_2$, or 6) $H_2$, HF, $F_2$, and a noble gas (e.g., argon (Ar) or helium (He)). Hydrogen ions ($H^+$) and hydrogen radicals (H.) in the plasma-excited treatment gas 101 react with the $SiO_2$ film 100 and facilitate oxygen (O) removal via O—H bond formation and subsequent formation and desorption of volatile $H_2O$ from the $SiO_2$ film 100. The plasma exposure forms a $SiO_x$ (x<2) surface layer 102 on the $SiO_2$ film 100, where the $SiO_x$ (x<2) surface layer 102 has low O-content and high Si-content relative to the $SiO_2$ film 100. The hydrogen ions ($H^-$), hydrogen radicals (H.), and plasma excited HF, $F_2$, or both HF and $F_2$, react with the $Si_3N_4$ film 120 to form an ammonium salt layer 122 containing $NH_4F$ and $(NH_4)_2SiF_6$. It is contemplated that the exposure to the plasma excited treatment gas forms Lewis bases such as —NH— and —$NH_2$ surface species, as well as $NH_3$ molecules. These Lewis bases subsequently react with acidic HF species to form the ammonium salt layer 122. FIG. 1C schematically shows the substrate 1 following the exposure to the plasma-excited treatment gas 101.

Figure 1D:
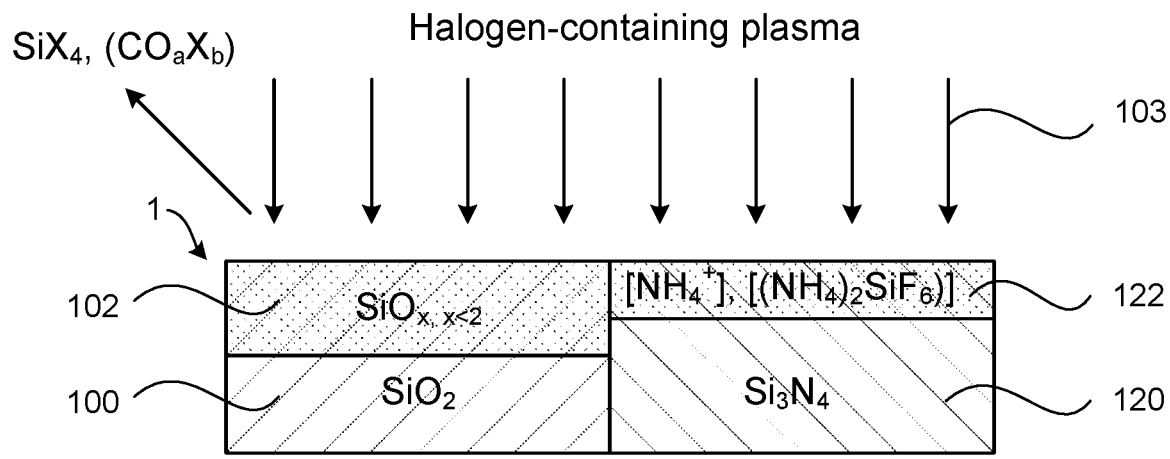
Figure 1E:
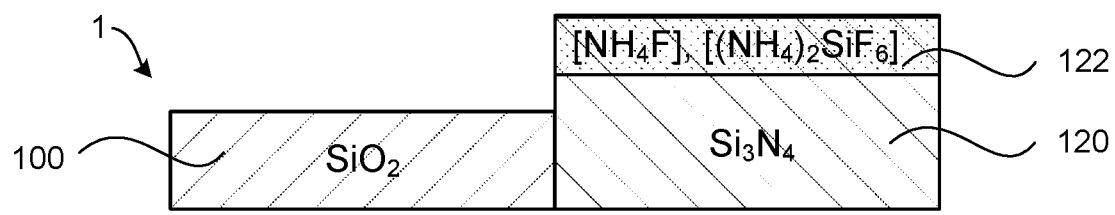
Figure 1F:
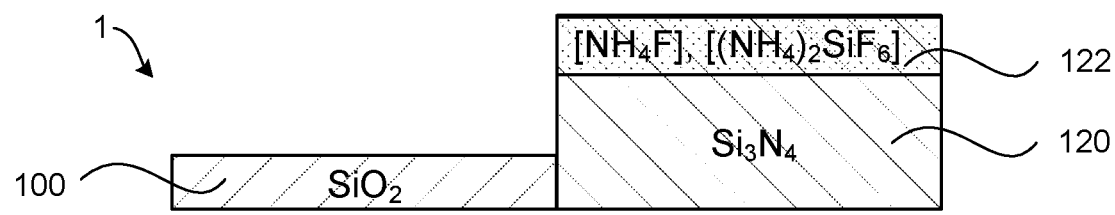

Thereafter, the method further includes exposing the substrate 1 to a halogen-containing plasma. In one embodiment, the halogen-containing plasma can include a plasma-excited halogen-containing gas 103, where the plasma-excited halogen-containing gas 103 reacts with and removes the $SiO_x$ surface layer 102 from the $SiO_2$ film 100 but the ammonium salt layer 122 protects the underlying $Si_3N_4$ film 120 from etching. Possible volatile reaction products include $SiX_4$ and $CO_aX_b$. This is schematically shown in FIGS. 1D and 1E. According to one embodiment, the halogen-containing gas can include a fluorine-containing gas (e.g. $CF_4$, $CHF_3$, $CH_2F_2$, $CH_3F$, $NF_3$, or $SF_6$, or a combination thereof), a chlorine-containing gas (e.g. $Cl_2$, $CCl_4$, $SiCl_4$, $SiH_2Cl_2$, or $CHCl_3$, or a combination thereof), a bromine-containing gas (e.g. HBr, $Br_2$, or $SiBr_4$, or a combination thereof), or a combination thereof. The halogen-containing gas can further include an additive gas (e.g. $O_2$, $N_2$, or $CO_2$, or a combination thereof). In some examples, the halogen-containing gas can include HBr and $O_2$, $Cl_2$ and $O_2$, or HBr, $Cl_2$ and $O_2$. According to another embodiment, the halogen-containing gas can include a fluoro-carbon-based gas that includes a fluorocarbon gas, a hydrofluorocarbon gas, or a combination thereof. The fluorocarbon-based gas may further contain a non-polymerizing gas (e.g., Ar, He, $SF_6$, or a combination thereof). For example, the fluorocarbon gas can contain or consist of $CF_4$, and the hydrofluorocarbon gas can contain or consist of $CHF_3$, $CH_2F_2$, $CH_3F$, or a combination thereof. The sequential and alternating steps of exposing the substrate 1 to the plasma-excited treatment gas 101 and exposing the substrate 1 to the plasma-excited halogen-containing gas 103 may be repeated at least once to further selectively etch the $SiO_2$ film 100 relative to the ammonium salt layer 122 on the $Si_3N_4$ film 120. The resulting substrate 1 is shown in FIG. 1F. The steps of pulsing the plasma-excited treatment gas 101 and the plasma-excited halogen-containing gas 103 may be interrupted by gas purging steps that remove the plasma species and any gaseous reaction byproducts from the plasma chamber.

Figure 1G:
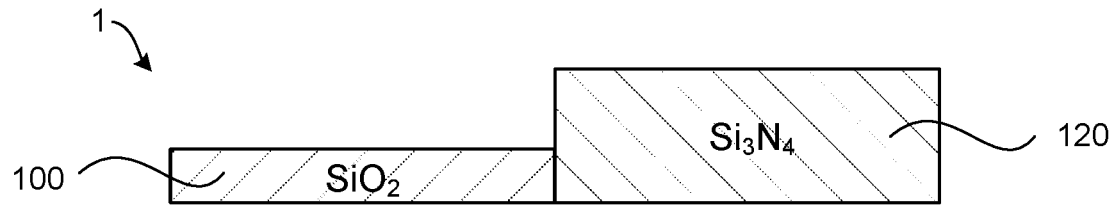

According to one embodiment, the method further includes removing the ammonium salt layer 122 from the $Si_3N_4$ film 120 (e.g., by wet cleaning, heating, or IR irradiation) when the desired etching of the $SiO_2$ film 100 has been achieved. The resulting substrate 1 is shown in FIG. 1G. According to one embodiment, the method further includes, following the removal of the ammonium salt layer 122 from the $Si_3N_4$ film 120, repeating the sequential and alternating steps of exposing the substrate 1 to the plasma-excited treatment gas 101 and exposing the substrate 1 to the plasma-excited halogen-containing gas 103 at least once to further selectively etch the $SiO_2$ film 100, and thereafter, removing the ammonium salt layer 122 from the $Si_3N_4$ film 120.

Halogen species generated in the plasma-excited halogen-containing gas 103 react with the $SiO_x$ surface layer 102 to form volatile $SiX_4$ species (where X is a halogen), and $CO_aX_b$ species when using a carbon-containing gas (e.g., $CCl_4$ or $CHCl_3$), that desorb from the substrate 1 and thereby etch the $SiO_x$ surface layer 102 and restore a $SiO_2$ surface. In contrast, the ammonium salt layer 122 protects the underlying $Si_3N_4$ film 120 from etching by the plasma-excited halogen-containing gas 103. Thus, the ammonium salt layer 122 functions as an etch stop layer (blocking layer) that hinders or prevents further modification/etching of the underlying $Si_3N_4$ film 120 when the steps of exposing the substrate 1 to the plasma-excited treatment gas 101, and exposing the substrate 1 to a plasma-excited halogen-containing gas 103, are repeated at least once to further selectively etch the $SiO_2$ film 100 relative to the $Si_3N_4$ film 120.

The selective $SiO_2/Si_3N_4$ etching process may be performed at substrate temperatures and gas pressures that optimize O removal from the $SiO_2$ film 100 by the plasma-excited treatment gas 101, optimize the ammonium salt formation on the $Si_3N_4$ film 120, and optimize the etching of the $SiO_x$ surface layer 102 by the plasma-excited halogen-containing gas 103. Examples include a substrate temperature between about −100° C. and about 25° C., between about −100° C. and about −30° C., between about −100° C. and about 0° C., between about −30° C. and about 25° C., or between about 0° C. and about 25° C. The gas pressure in the plasma etch chamber can between about 10 mTorr and about 500 mTorr, between about 10 mTorr and 200 mTorr, or between about 20 mTorr and about 100 mTorr. Further, the use of low energy ions in the plasma that impinge on the substrate 1 provides good $SiO_2/Si_3N_4$ etch selectivity, provides good control over the $SiO_2$ etch depth per cycle, avoids or reduces excessive physical sputtering of $Si_3N_4$ film 120 and the ammonium salt layer 122, and reduces the ion implantation depth. Still further, the addition of the non-polymerizing gas may be used during the exposure to the carbon-containing gas to enhance the removal of the $SiO_x$ surface layer 102.

FIGS. 2A-2G schematically show through cross-sectional views a method of selective plasma etching of a $SiO_2$ film relative to a $Si_3N_4$ film by gas pulsing according to another embodiment of the invention. The method combines selective ammonium salt formation on the $Si_3N_4$ film and selective chemical reduction of the $SiO_2$ film to provide highly controllable and selective $SiO_2/Si_3N_4$ etching.

Figure 2A:
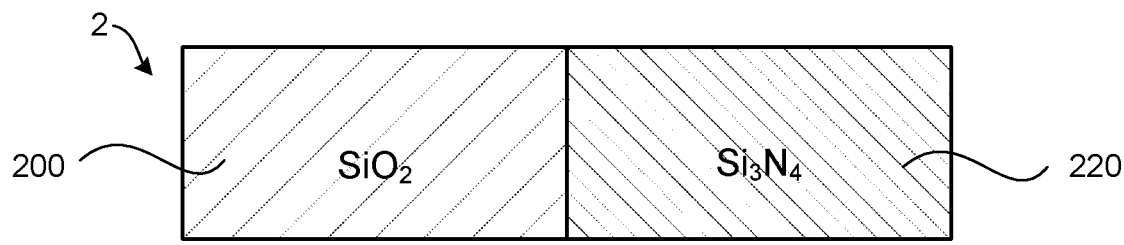

FIG. 2A schematically shows a substrate 2 containing a $SiO_2$ film 200 and a $Si_3N_4$ film 220. In the example shown in FIG. 2A, the $SiO_2$ film 200 and the $Si_3N_4$ film 220 are in the same horizontal plane, but embodiments of the invention may also be applied to films that are not in the same horizontal plane but are offset vertically.

Figure 2B:
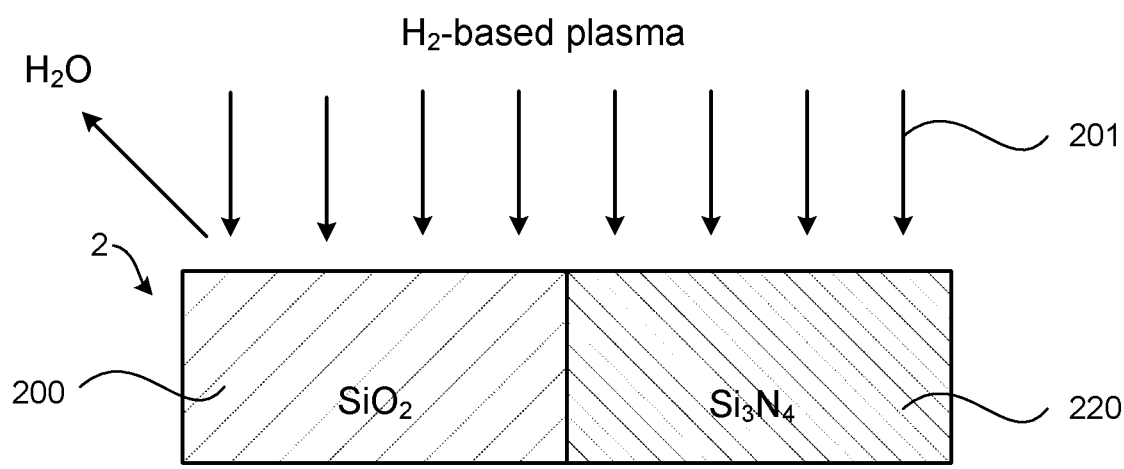
Figure 2C:
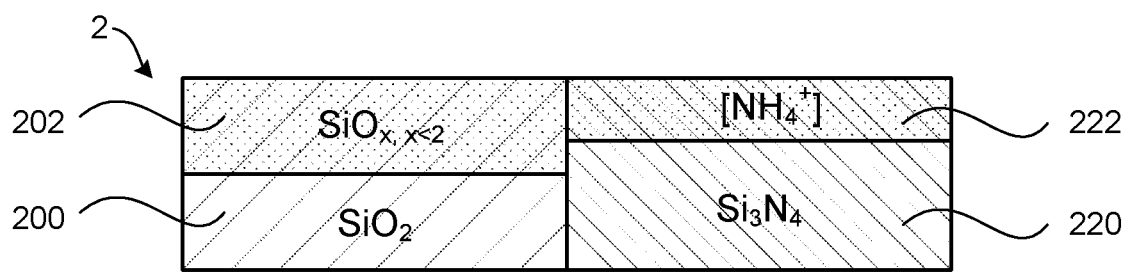

The method includes treating the substrate 2 with a $H_2$-based plasma that can include plasma-excited $H_2$-containing gas 201 as is schematically shown in FIG. 2B. The $H_2$-containing gas can, for example, consist of $H_2$, or $H_2$ and a noble gas (e.g., argon (Ar) or helium (He)). Hydrogen ions ($H^+$) and hydrogen radicals (H.) in the plasma-excited $H_2$-containing gas 201 react with the $SiO_2$ film 200 and facilitate oxygen (O) removal via O—H bond formation and subsequent formation and desorption of volatile $H_2O$ from the $SiO_2$ film 200. The plasma exposure forms a $SiO_x$ (x<2) surface layer 202 on the $SiO_2$ film 200, where the $SiO_x$ (x<2) surface layer 202 has low O-content and high Si-content relative to the $SiO_2$ film 200. In contrast, the hydrogen ions ($H^+$) and the hydrogen radicals (H.) react with the $Si_3N_4$ film 220 by surface hydrogenation/protonation rather than nitrogen (N) removal, thereby forming a hydrogenated $Si_3N_4$ surface layer 222 that is ammonium ($NH_4^+$-rich. FIG. 2C schematically shows the substrate 2 following the exposure to the plasma-excited $H_2$-containing gas 201.

Figure 2D:
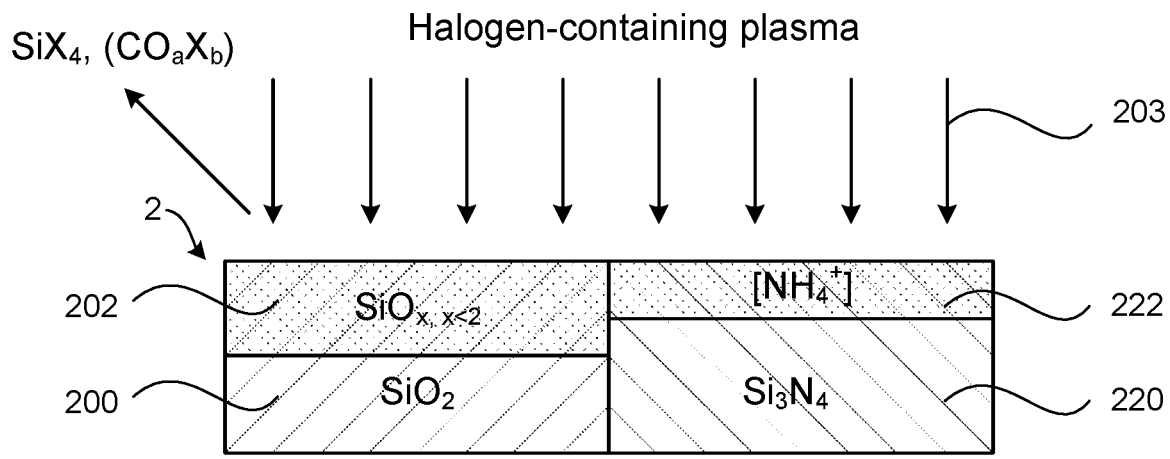
Figure 2E:
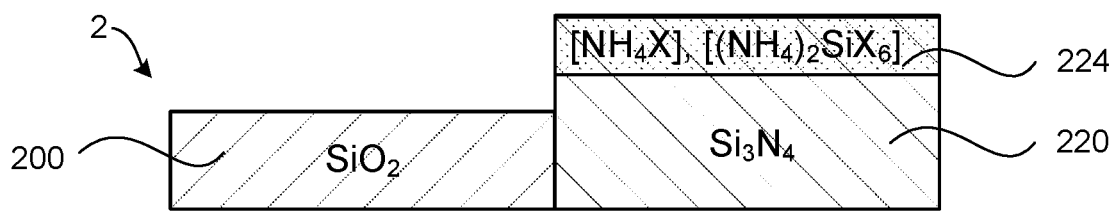

Thereafter, the method further includes exposing the substrate 2 to a plasma-excited halogen-containing gas 203, where the exposing reacts with and removes the $SiO_x$ surface layer 202 from the $SiO_2$ film 200 and forms an ammonium salt layer 224 by reacting with the hydrogenated $Si_3N_4$ surface layer 222. This is schematically shown in FIGS. 2D and 2E. Some of the different halogen-containing gases and additive gases that may be used were described above in reference to FIG. 1D.

Figure 2F:
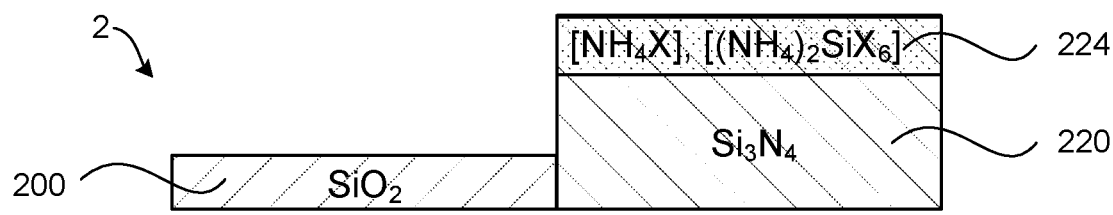
Figure 2G:
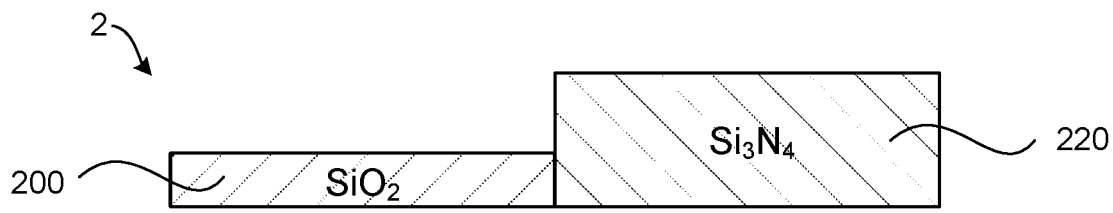

The sequential and alternating steps of treating the substrate 2 with the plasma-excited $H_2$-containing gas 201 and exposing the substrate 2 to the plasma-excited halogen-containing gas 203 may be repeated at least once to further selectively etch the $SiO_2$ film 200 relative to the ammonium salt layer 224 on the $Si_3N_4$ film 220. The resulting substrate 2 is shown in FIG. 2F. The steps of pulsing the plasma-excited $H_2$-containing gas 201 and the plasma-excited halogen-containing gas 203 may be interrupted by gas purging steps that remove the plasma species and any gaseous reaction byproducts from the plasma chamber. According to one embodiment, the method further includes removing the ammonium salt layer 224 from the $Si_3N_4$ film 220 when the desired etching of the $SiO_2$ film 200 has been achieved (e.g. by wet cleaning, heating, or IR irradiation). The resulting substrate 2 is shown in FIG. 2G. According to one embodiment, the method further includes, following the removing of the ammonium salt layer 224 from the $Si_3N_4$ film 220, repeating the sequential and alternating steps of exposing the substrate 2 with the plasma-excited $H_2$-containing gas 201 and exposing the substrate 2 to the plasma-excited halogen-containing gas 203 at least once to further selectively etch the $SiO_2$ film 200, and thereafter, removing the ammonium salt layer 224 from the $Si_3N_4$ film 220.

Halogen species generated in the plasma-excited halogen-containing gas 203 react with the $SiO_x$ surface layer 202 to form volatile $SiX_4$ (where X is a halogen), and $CO_aX_b$ species when using a carbon-containing gas, that desorb from the substrate 2 and thereby etch the $SiO_x$ surface layer 202 and restore a $SiO_2$ surface. In contrast, the species generated in the plasma-excited halogen-containing gas 203 react with the hydrogenated $Si_3N_4$ surface layer 222 to form the ammonium salt layer 224 that functions as an etch stop layer (blocking layer) that hinders or prevents further modification/etching of the underlying $Si_3N_4$ film 220 when the steps of treating the substrate 2 with the plasma-excited $H_2$-containing gas 201, and exposing the substrate 2 to the plasma-excited halogen-containing gas 203, are repeated at least once to further selectively etch the $SiO_2$ film 200 relative to the $Si_3N_4$ film 220.

The selective $SiO_2/Si_3N_4$ etching process may be performed at substrate temperatures and gas pressures that optimize O removal from the $SiO_2$ film 200 by the plasma-excited $H_2$-containing gas 201, and optimize the ammonium salt formation on the $Si_3N_4$ film 220 by the plasma-excited halogen-containing gas 203. Examples include a substrate temperature between about −100° C. and about 25° C., between about −100° C. and about −30° C., between about −100° C. and about 0° C., between about −30° C. and about 25° C., or between about 0° C. and about 25° C. The gas pressure in the plasma etch chamber can between about 10 mTorr and about 500 mTorr, between about 10 mTorr and 200 mTorr, or between about 20 mTorr and about 100 mTorr. Further, the use of low energy of ions in the plasma that impinge on the substrate 2 provides good $SiO_2/Si_3N_4$ etch selectivity, provides good control over the $SiO_2$ etch depth per cycle, avoids or reduces excessive physical sputtering of $Si_3N_4$ film 220 and the ammonium salt layer 224, and reduces the ion implantation depth. Still further, the addition of a non-polymerizing gas may be used during the exposure to the carbon-containing gas to enhance the removal of the $SiO_x$ surface layer 202.

A plurality of embodiments for a method of selective plasma etching of silicon oxide relative to silicon nitride in semiconductor manufacturing have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A plasma processing method, comprising:
   a) providing a substrate containing a silicon oxide film and a silicon nitride film;
   b) exposing the substrate to a plasma-excited treatment gas consisting of 1) $H_2$ and HF, 2) $H_2$, HF, and a noble gas, 3) $H_2$ and $F_2$, 4) $H_2$, $F_2$, and a noble gas, 5) $H_2$, HF, and $F_2$, or 6) $H_2$, HF, $F_2$, and a noble gas, to form a silicon oxide surface layer with reduced oxygen content on the silicon oxide film and form an ammonium salt layer on the silicon nitride film;
   c) exposing the substrate to a plasma-excited halogen-containing gas that reacts with and removes the silicon oxide surface layer from the silicon oxide film, wherein the plasma-excited halogen-containing gas includes a fluorocarbon gas, a hydrofluorocarbon gas, or a combination thereof, and wherein step c) is performed following step b); and
   d) repeating steps b) and c) at least once to further selectively etch the silicon oxide film relative to the ammonium salt layer on the silicon nitride film.

2. The method of claim 1, wherein the silicon oxide film includes $SiO_2$ and the silicon oxide surface layer includes $SiO_x$, where x<2.

3. The method of claim 1, wherein the silicon nitride film includes $Si_3N_4$.

4. The method of claim 1, wherein the ammonium salt layer includes $NH_4F$, $(NH_4)_2SiF_6$, or a combination thereof.

5. The method of claim 1, wherein the plasma-excited halogen-containing gas contains $CF_4$, $CHF_3$, $CH_2F_2$, or $CH_3F$, or a combination thereof.

6. The method of claim 1, further comprising:
   following step d), e) removing the ammonium salt layer from the silicon nitride film.

7. The method of claim 6, further comprising
   f) repeating steps b)-e) at least once to further selectively etch the silicon oxide film.

8. A plasma processing method, comprising:
   a) providing a substrate containing a silicon oxide film and a silicon nitride film;
   b) exposing the substrate to a plasma-excited $H_2$-containing gas to form a silicon oxide surface layer with reduced oxygen content on the silicon oxide film and form a hydrogenated silicon nitride surface layer on the silicon nitride film, wherein the plasma-excited $H_2$-containing gas consists of $H_2$, or $H_2$ and a noble gas;
   c) exposing the substrate to a plasma-excited halogen-containing gas that reacts with and removes the silicon oxide surface layer from the silicon oxide film and forms an ammonium salt layer from the hydrogenated silicon nitride surface layer, wherein the plasma-excited halogen-containing gas includes a fluorocarbon gas, a hydrofluorocarbon gas, or a combination thereof, and wherein step c) is performed following step b); and
   d) repeating steps b) and c) at least once to further selectively etch the silicon oxide film relative to the ammonium salt layer on the silicon nitride film.

9. The method of claim 8, wherein the silicon oxide film includes $SiO_2$ and the silicon oxide surface layer includes $SiO_x$, where x<2.

10. The method of claim 8, wherein the silicon nitride film includes $Si_3N_4$.

11. The method of claim 8, wherein the ammonium salt layer includes $NH_4X$, $(NH_4)_2SiX_6$, or a combination thereof, where X is a halogen.

12. The method of claim 8, wherein the plasma-excited halogen-containing gas includes $CF_4$, $CHF_3$, $CH_2F_2$, $CH_3F$, $NF_3$, $SF_6$, $Cl_2$, $CCl_4$, $SiCl_4$, $SiH_2Cl_2$, $CHCl_3$, HBr, $Br_2$, or $SiBr_4$, or a combination thereof.

13. The method of claim 8, wherein the plasma-excited halogen-containing gas contains $CF_4$, $CHF_3$, $CH_2F_2$, $CH_3F$, or a combination thereof.

14. The method of claim 8, further comprising:
   following step d), e) removing the ammonium salt layer from the silicon nitride film.

15. The method of claim 14, further comprising
   f) repeating steps b)-e) at least once to further selectively etch the silicon oxide film.

16. A plasma processing method, comprising:
   a) providing a substrate containing a silicon oxide film and a silicon nitride film;
   b) exposing the substrate to a plasma-excited treatment gas consisting of 1) $H_2$ and HF, 2) $H_2$, HF, and a noble gas, 3) $H_2$ and $F_2$, 4) $H_2$, $F_2$, and a noble gas, 5) $H_2$, HF, and $F_2$, or 6) $H_2$, HF, $F_2$, and a noble gas, to form a silicon oxide surface layer with reduced oxygen content on the silicon oxide film and form an ammonium salt layer on the silicon nitride film;
   c) exposing the substrate to a plasma-excited halogen-containing gas that reacts with and removes the silicon oxide surface layer from the silicon oxide film, wherein the plasma-excited halogen-containing gas includes $CF_4$, $CHF_3$, $CH_2F_2$, $CH_3F$, $NF_3$, $SF_6$, $Cl_2$, $CCl_4$, $SiCl_4$, $SiH_2Cl_2$, $CHCl_3$, HBr, $Br_2$, or $SiBr_4$, or a combination thereof, and wherein step c) is performed following step b); and
   d) repeating steps b) and c) at least once to further selectively etch the silicon oxide film relative to the ammonium salt layer on the silicon nitride film.

17. The method of claim 16, wherein the silicon oxide film includes $SiO_2$, the silicon oxide surface layer includes $SiO_x$, where x<2, and the silicon nitride film includes $Si_3N_4$.

18. The method of claim 16, further comprising:
   following step d), e) removing the ammonium salt layer from the silicon nitride film.

19. The method of claim 18, further comprising:
   f) repeating steps b)-e) at least once to further selectively etch the silicon oxide film.

* * * * *